US006965278B2

(12) United States Patent
Lin et al.

(10) Patent No.: US 6,965,278 B2
(45) Date of Patent: Nov. 15, 2005

(54) AMPLIFIER CIRCUIT WITH ACTIVE GAIN STEP CIRCUIT

(75) Inventors: Chih-I Lin, Unterhaching (DE); Klaus Scheiblhofer, Linz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/783,704

(22) Filed: Feb. 20, 2004

(65) Prior Publication Data

US 2005/0024135 A1    Feb. 3, 2005

(30) Foreign Application Priority Data

Feb. 20, 2003  (DE) ................. 103 07 316

(51) Int. Cl.[7] ............................................... H03F 1/14
(52) U.S. Cl. ................... 333/51; 333/296; 333/285; 333/297
(58) Field of Search ................. 333/51, 296, 285, 333/289, 297, 133, 267, 261

(56) References Cited

U.S. PATENT DOCUMENTS

| | | | | |
|---|---|---|---|---|
| 5,880,631 | A * | 3/1999 | Sahota | ................. 330/51 |
| 6,144,254 | A | 11/2000 | Irvine et al. | |
| 6,522,195 | B2 * | 2/2003 | Watanabe et al. | ............. 330/51 |
| 6,624,702 | B1 * | 9/2003 | Dening | ................. 330/297 |
| 6,731,171 | B2 * | 5/2004 | Yamashita | ................. 330/285 |
| 6,768,377 | B2 * | 7/2004 | Macedo | ................. 330/51 |
| 6,803,822 | B2 * | 10/2004 | Kim et al. | ................. 330/296 |

FOREIGN PATENT DOCUMENTS

DE    10084663 T1    5/2002

* cited by examiner

*Primary Examiner*—Lam Mai
(74) *Attorney, Agent, or Firm*—Maginot, Moore & Beck

(57) ABSTRACT

An amplifier circuit comprises a main stage amplifier connected between a RF input and a RF output and at least one secondary stage amplifier, which is connected in parallel to the main stage amplifier between the RF input and the RF output. The secondary stage amplifier comprises an input bipolar transistor, whose collector terminal or emitter terminal is high frequency-coupled to the RF input. The secondary stage amplifier further comprises an output bipolar transistor, whose base terminal is high frequency-coupled to the base terminal of the input bipolar transistor and whose collector terminal or emitter terminal is high frequency-coupled to the RF output. The output bipolar transistor is further coupled to a supply voltage terminal.

20 Claims, 5 Drawing Sheets

AMPLIFIER CIRCUIT WITH ACTIVE GAIN STEP CIRCUIT

BACKGROUND OF THE INVENTION

1. Field of the Invention

The present invention relates to an amplifier circuit, and particularly to an amplifier circuit, which has a main stage amplifier and at least one secondary stage amplifier, so that the amplifier circuit allows to switch between the main stage amplifier and the secondary stage amplifier in dependency on the input signal.

2. Description of Prior Art

In low-noise high frequency amplifiers with high amplification, which are referred to as LANs (LAN=low noise amplifier), it is very important to provide as little load as possible to the high frequency input. If, however, several amplification stages are required, between which a switchover can be performed, as it can be particularly the case in the field of mobile telecommunication and there, particularly, with mobile telephones, they also have to be coupled to the RF input. These secondary stages generate a capacity in parallel to the main stage, and thus reduce the performance of the main stage. The same problem holds true, in a slightly reduced form, for the output side of the amplifier arrangement, since the secondary stage of several secondary stages are connected in parallel between the RF input and the RF output.

In such a multi-stage RF amplifier, where several amplification stages are connected in parallel to different amplification, it is possible to switch over between the different amplification stages depending on the input signal level, to avoid overriding of the individual stages. In such LANs with several amplification stages connected in parallel it is necessary that independent of which amplification stage is connected between the RF input and the RF output, an input matching and output matching, respectively, usually to 50 ohm, is guaranteed.

One example of a main stage of an RF amplifier 10 according to the prior art is shown in FIG. 1. The main stage amplifier comprises a bipolar transistor VT1, whose base terminal is connected to an RF input HFin. The emitter terminal of the transistor VT1 is connected to ground. The collector terminal of the transistor VT1 is connected to an RF output HFout via a decoupling capacitor VC1. Further, the collector of the transistor VT1 is connected to a supply voltage potential Vcc via a resistor VR1 and an inductance VL1. Another resistor VR2 is connected between the collector terminal and the base terminal of the main stage transistor VT1. The resistor VR2 serves for the operating point setting of the main stage transistor VT1, while the capacitor VC1 serves for DC decoupling and the inductance VL1 as RF choke. The resistor VR1 and the inductance VL1 are further operative as load for the bipolar transistor VT1. A so-called LC sump, which has an external inductivity $L_{ext}$ and an external capacity $C_{ext}$ is preferably provided at the RF input of the main stage amplifier 10. This LC sump serves to reduce distortions due to the IIP3 (IIP3=input intercept point 3).

To avoid an override of such a main stage amplifier at a high input signal level, whose elements are dimensioned to provide a high amplification of input signal from the RF input to the RF output, it is known to use so-called gain step circuits. These can be passive or active. Passive gain step circuits do not provide an amplification between the RF input and the RF output, when they are switched on. In such passive realizations, however, one has to live with the fact that the reverse insulation is identical to a forward attenuation.

Still, in the past, active gain step circuits have been avoided, wherein, if active gain step stages have been realized, nevertheless, they had been mostly implemented in a similar way to the embodiment shown in FIG. 2.

The gain step circuit 20 shown in FIG. 2, which can be referred to as secondary stage amplifier, comprises a transistor T1, whose collector terminal is connected to the main stage amplifier at a switching node 22 (see also FIG. 1), i.e. high frequency-coupled to the RF output HFout. The emitter terminal of the transistor T1 is connected to a reference potential, normally ground, via a resistor R1. The base terminal of the transistor T1 is connected to a bias terminal 26 via a bias resistor VR1, and to the RF input HFin via a capacity 24, which enables the separate DC biasing of the base terminal of the transistor T1. Thus, the gain step circuit 20 shown in FIG. 1 is connected in parallel to the main stage amplifier 10 shown in FIG. 1 between the RF input HFin and the RF output HFout. Since the collector terminal of the transistor T1 is coupled to the RF output at the circuit node 22, i.e. prior to the decoupling capacitor VC1, an appropriate supply voltage is applied to the transistor T1 via the resistor VR1 and inductance VL1. The secondary stage amplifier shown in FIG. 1 is thereby designed to provide a smaller amplification than the main stage amplifier, so that a switchover to the secondary stage amplifier can be performed at a high-level input signal to avoid overriding of the main stage amplifier.

However, a disadvantage of the above described solution is that the main stage is significantly loaded with the capacities of the transistor T1 in a range of 200 to 400 fF at the RF input. This leads to a significant deterioration of the performance of the main stage amplifier with regard to amplification and noise performance.

SUMMARY OF THE INVENTION

It is the object of the present invention to provide an amplifier circuit with a main stage amplifier and a secondary stage amplifier where a load of the RF input is reduced.

In accordance with a first aspect, the present invention provides an amplifier circuit, having a main stage amplifier, connected between an RF input and an RF output, and at least one secondary stage amplifier, which is connected in parallel to the main stage amplifier between the RF input and the RF output, wherein the secondary stage amplifier comprises an input bipolar transistor, whose collector terminal or emitter terminal is high frequency-coupled to the RF input; an output bipolar transistor, whose base terminal is high frequency-coupled to the base terminal of the input bipolar transistor, whose collector terminal or emitter terminal is high frequency-coupled to the RF output, wherein the output bipolar transistor is further coupled to a supply voltage terminal.

In the inventive amplifier circuit, the main stage amplifier is switched on in a high gain mode, while the secondary stage amplifier is switched off. Thus, the main stage amplifier is operative to couple an input signal from the RF input to the RF output, while the secondary stage amplifier is not operative to couple an input signal from the RF input to the RF output. In a gain step mode, the main stage amplifier is switched-off and the secondary stage amplifier is switched-on, so that in this case, the secondary stage amplifier is operative to couple an input signal from the RF input to the RF output.

In a switched-off state of the secondary stage amplifier, the diode structures of the input bipolar transistor and the output bipolar transistor switched into the RF path, are reverse-polarised. In the switched-on state of the secondary stage amplifier, appropriate bias voltages are applied to the input bipolar transistor and the output bipolar transistor to operate the diode structure of the input bipolar transistor switched into the RF path in saturation in flow direction, and to provide the base terminal of the output bipolar transistor with an operating point potential, so that the output bipolar transistor provides a desired forward transmission, i.e. amplification.

Since the capacity of the base collector diode of a bipolar transistor is normally smaller than the capacity of its base emitter diode, the collector terminal of the input bipolar transistor is high frequency-coupled to the RF input, in preferred embodiments of the invention, while the collector terminal of the output bipolar transistor is high frequency-coupled to the RF output.

The bias voltages of the input bipolar transistor and the output bipolar transistor in the switched-on state of the secondary stage amplifier can be provided by a common bias supply or by separate bias supplies for the input bipolar transistor and the output bipolar transistor, which enables a higher flexibility.

The terminal of the input bipolar transistor and the output bipolar transistor, which is not coupled to the RF input and the RF output, respectively, i.e. normally their emitter terminal, is connected to a reference potential, normally mass, via a respective resistor. Thus, the input impedance and the output impedance of the gain step circuit can easily be set by modifying the transistor size and the named resistors, so that these impedances have the same or similar values like the main stage. This property enables a good matching at the input/output in the secondary stage. Additionally, the matching of the main stage is only insignificantly changed.

By the inventive design, the gain step circuit, i.e. the secondary stage amplifier, consumes a lower operating current than the main stage amplifier. Above that, the forward transmission factor in the secondary stage can easily be set by resistors and the control current, which is supplied by the supply voltage, and can easily be varied in a wider range in comparison to passive gain step circuits for different applications. Thus, in the secondary stage, higher IP3 values (IP3=third order intercept point) can be obtained with lesser current consumption.

If the secondary stage is switched-off, the collector base diode of the input bipolar transistor and the collector base diode of the output bipolar transistor are reverse-biased. Thus, a good isolation of the gain step circuit to the main stage amplifier is enabled by the low barrier layer capacity of these diodes. This makes possible the already mentioned separation of the design of the circuit for the main stage and for the secondary stage, which leads to decreased development times.

The principle underlying the present invention consists of the combination of the input via the input bipolar transistor, and the output via the output bipolar transistor, wherein (in preferred embodiments) collector base diode paths, or (in less preferred embodiments) emitter base diode paths, respectively, of the input bipolar transistor and the output bipolar transistor are switched into the RF path. Thereby, a main stage in a common emitter circuit is loaded only minimally and the input matching and the output matching for all stages is made significantly easier.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 3:
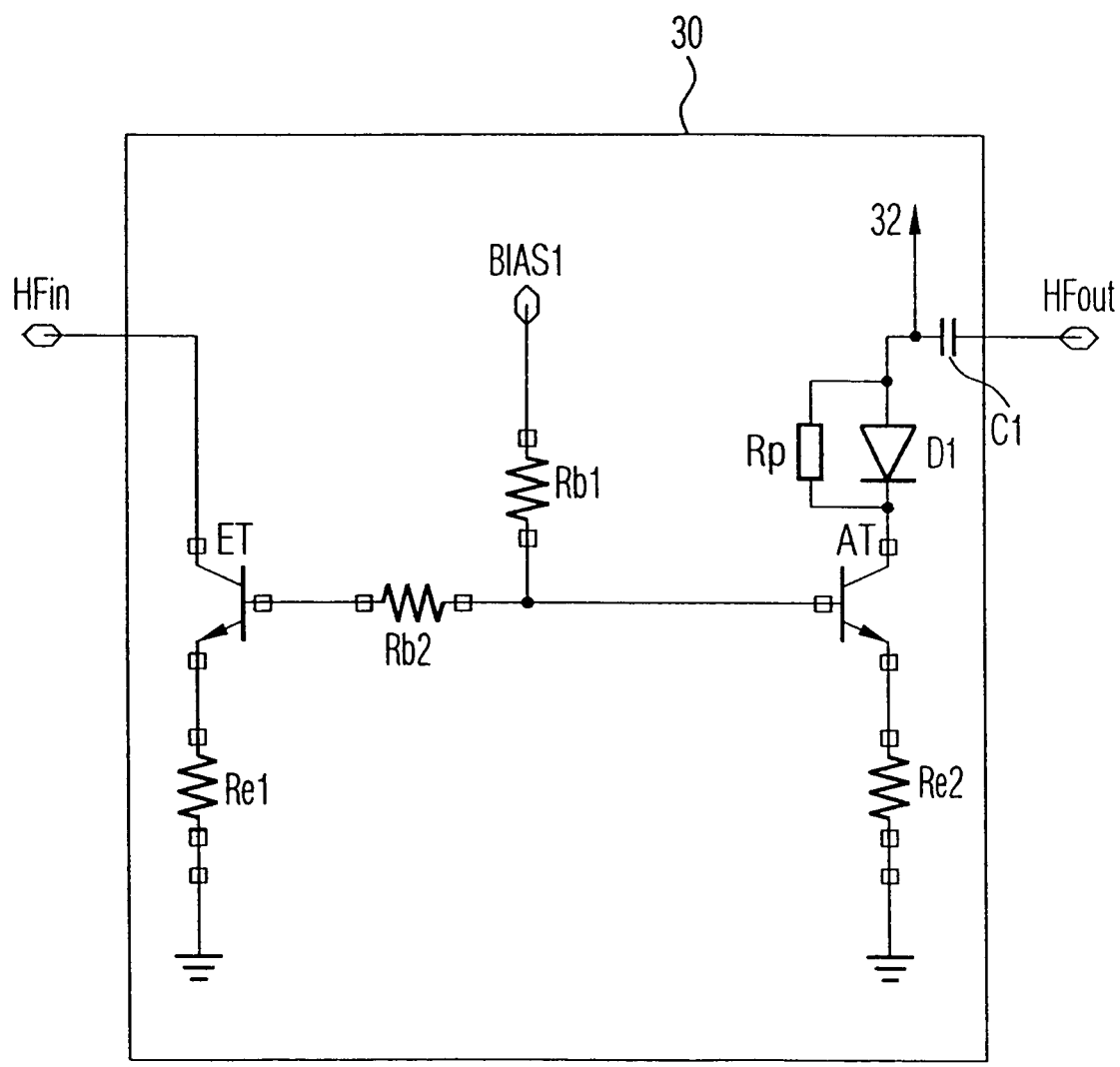
FIG. 3 is an example of a secondary stage amplifier for an embodiment of an inventive amplifier circuit.
Figure 4:
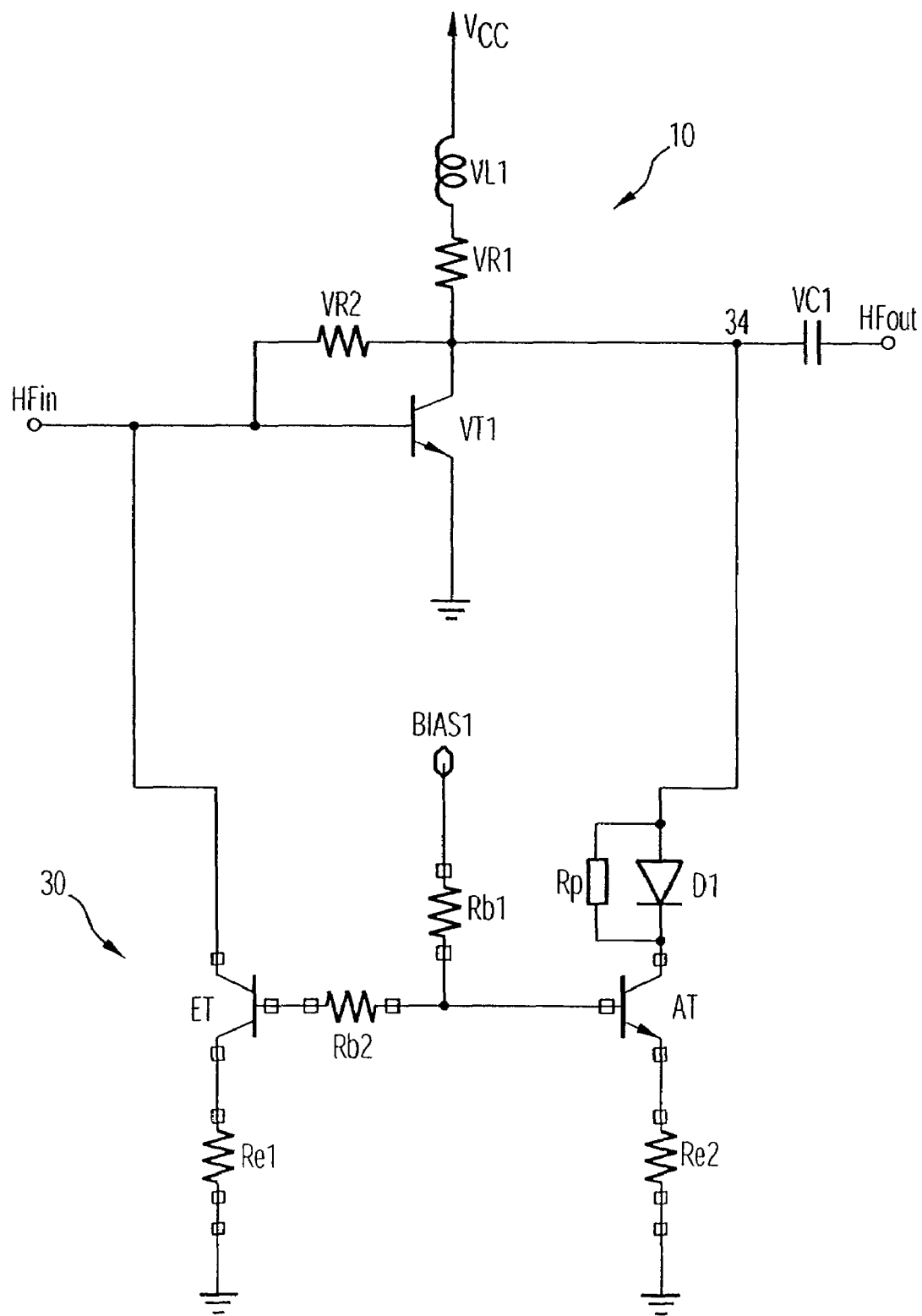
FIG. 4 is an embodiment of an inventive amplifier circuit.

With reference to FIGS. 3 and 4, a first embodiment of an inventive amplifier circuit will be discussed below in more detail, wherein first a secondary stage amplifier is addressed with reference to FIG. 3.

The secondary stage amplifier 30 comprises an input bipolar transistor ET and an output bipolar transistor AT. The input terminal of the input bipolar transistor ET is connected to the RF input HFin. The emitter terminal of the input bipolar transistor ET is connected to a reference potential, in the shown embodiment ground, via a resistor Re1. The collector terminal of the output bipolar transistor AT is high frequency coupled to the RF output RFout, in the illustrated embodiment via a diode D1 and a decoupling capacitor C1. Further, the collector terminal of the output bipolar transistor AT is connected to a supply voltage terminal 32 via the diode D1, across which a supply voltage is applied, which operates the diode D1 in flow direction and provides to the operating current for the output bipolar transistor AT. The diode is not necessarily required, but it is advantageous in such that it provides normally a lesser capacitance to the main stage than the transistor AT.

The emitter terminal of the output bipolar transistor AT is connected to a reference potential, in the shown embodiment ground, via a resistor Re2. The base terminals of the transistors ET and AT are connected to a bias terminal Bias1 via a bias resistor Rb1. By an appropriate choice of the size of Rb1, it can further be avoided that RF portions leak to the voltage source. Further, in the shown embodiment, another bias resistor Rb2, which is, however, optional, is connected between the base terminal of the input bipolar transistor and the bias resistor Rb1. The bias resistor Rb2 enables the setting of different base voltages at the input bipolar transistor ET and the output bipolar transistor AT. Additionally, the resistor Rb2 attenuates the signal to be transmitted, so that by appropriate choice of it the attenuation can be set. The bias resistors Rb1 and Rb2 are merely exemplarily for arbitrary resistor arrangements, which can be provided to enable the application of an appropriate bias voltage to the base terminals of the transistors ET and AT.

Figure 1:
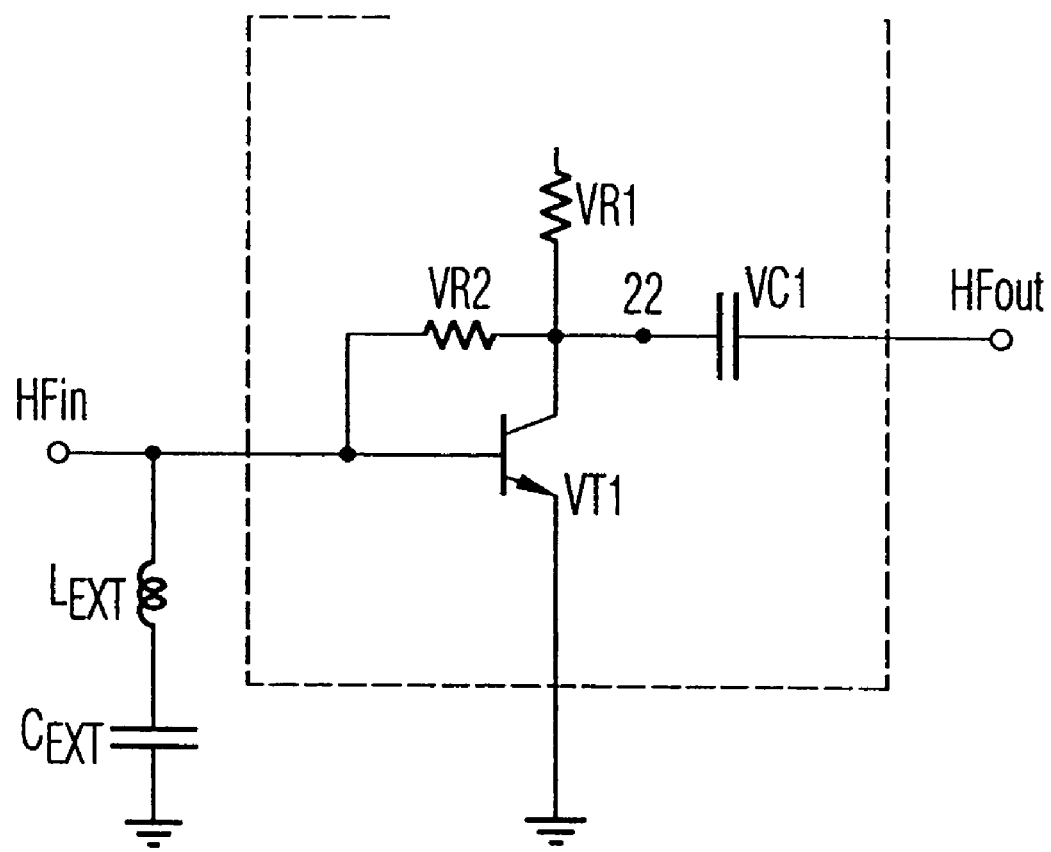
FIG. 1 is an example of a known main stage amplifier.
Figure 2:
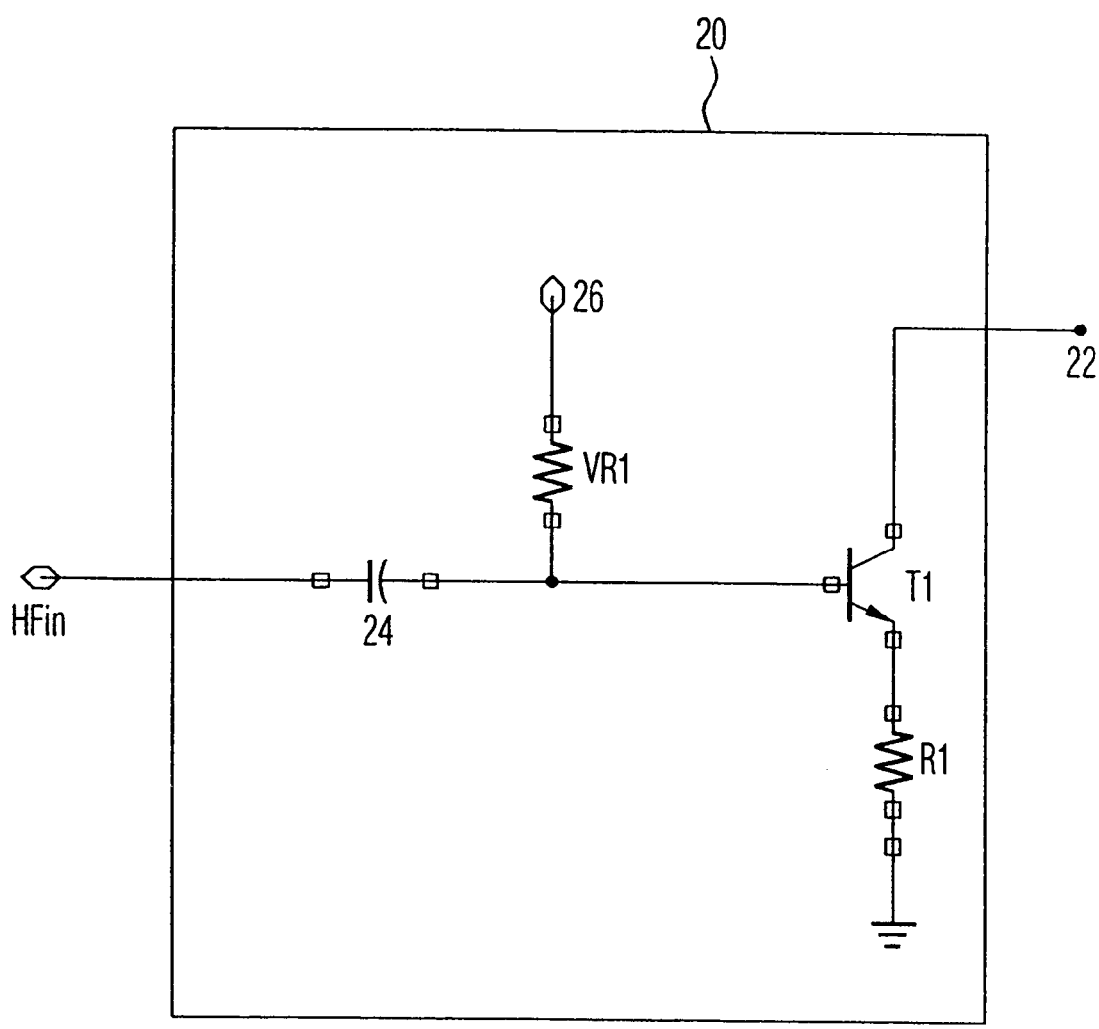
FIG. 2 is an example of a known secondary stage amplifier.

One embodiment of an inventive amplifier circuit, which has the secondary stage amplifier as shown in FIG. 3 as well as a main stage amplifier shown in FIG. 1, is shown in FIG. 4. Thereby, the main stage amplifier 10 and the secondary stage amplifier 30 are connected in parallel between the RF input HFin and the RF output HFout. As can further be seen in FIG. 4, the decoupling capacitor C1 shown in FIG. 3 can be formed by the decoupling capacitor VC1 shown in FIG. 1, i.e. main stage and secondary stage have a common decoupling capacitor. Further, it can be seen from FIG. 4 that the supply voltage terminal 32 shown in FIG. 3 is, in the illustrated embodiment, connected to the collector terminal of the main stage transistor VT1, or corresponds to it, respectively, so that the supply voltage for the output transistor AT corresponds to the supply voltage of the main stage transistor VT1 and is supplied through the supply voltage potential Vcc, the inductance VL1 and the resistor VR1.

First, it is assumed, that the main stage is active and the secondary stage is inactive. In this case, a potential of 0 volt is applied to the bias terminal Biasl in the shown embodiment. At the base terminal of the main stage transistor VT1, its operating point potential is applied, which is, for example, 0.8 volt. Thus, the collector base voltage of the input transistor ET is 0.8 volt, so that the base collected diode of the input bipolar transistor ET is reverse-biased. Thus, the base collector diode shows the smallest possible capacitance. The base collector diode of the output bipolar transistor AT is also reverse-polarized, since a predetermined positive potential of, for example, about 2.7 volt is present over Vcc at a circuit node 34, while the base terminal of the output transistor AT is 0 volt.

The diode D1 is provided to achieve that the main stage sees also at the output only a small capacity, in series with the base collector capacitor of the output bipolar transistor AT. The diode D1 is biased in flow direction by the potential at the circuit node 34. Providing the diode is optional, to improve the performance at the output, since the output bipolar transistor, to achieve a predetermined amplification and to achieve a desired output matching, respectively, can be designed with regard to its size such that no desired decoupling can be achieved at the output in the reverse direction by its collector base capacitor. In such a case, the behavior can be improved by providing at diode D1. A high impedance resistor can be connected in parallel to the diode, to provide a DC path when switching-over.

As has been described above, the main stage is active in the high gain mode to amplify an input signal from the RF input to the RF output, while the secondary stage 30 is inactive and decoupled from the main stage by the described small capacities.

The secondary stage is activated and switched-on, respectively, by applying a bias voltage to the bias terminal Bias1. This bias voltage has to be sufficient to bias the collector base diode of the input bipolar transistor ET in a forward direction, to enable an attenuated coupling of the RF power into the secondary stage amplifier. Further, the bias voltage applied to the bias terminal Bias1 switches the decoupling transistor AT to which a supply voltage is supplied via the circuit node 34, into the desired operating point, so that it provides an amplification of the RF signal coupled in via the input transistor ET, wherein the RF signal is coupled to the RF output HFout via the diode D1 and the decoupling capacitor VC1.

In the embodiment illustrated in FIG. 4, the input transistor ET further operates as switch to switch-off the main stage amplifier. Specifically, by switching-in the bias voltage at the bias terminal Bias1, both the collector base diode and the base emitter diode of the input bipolar transistor ET are polarized in flow direction, so that the potential at the base terminal of the main stage transistor VT1 via the transistor ET and the resistor Re1 is pulled-down such that the main stage amplifier is switched-off. Alternatively, a separate switch for switching-off the main stage amplifier could be provided when the main stage amplifier is switched-on.

Apart from a very low load of the RF input and the RF output, which is achieved by the switchable capacities of the base collected diode from bipolar transistors, the inventive arrangement of the secondary stage amplifier enables further a very good impedance matching at the input and at the output. Specifically, a desired input matching can be achieved by varying the transistor size of the input transistor ET as well as by varying the emitter resistor Re1. An output matching can be achieved in a similar manner by varying the transistor size of the output transistor AT as well as by varying the emitter resistor Re2.

Figure 5:
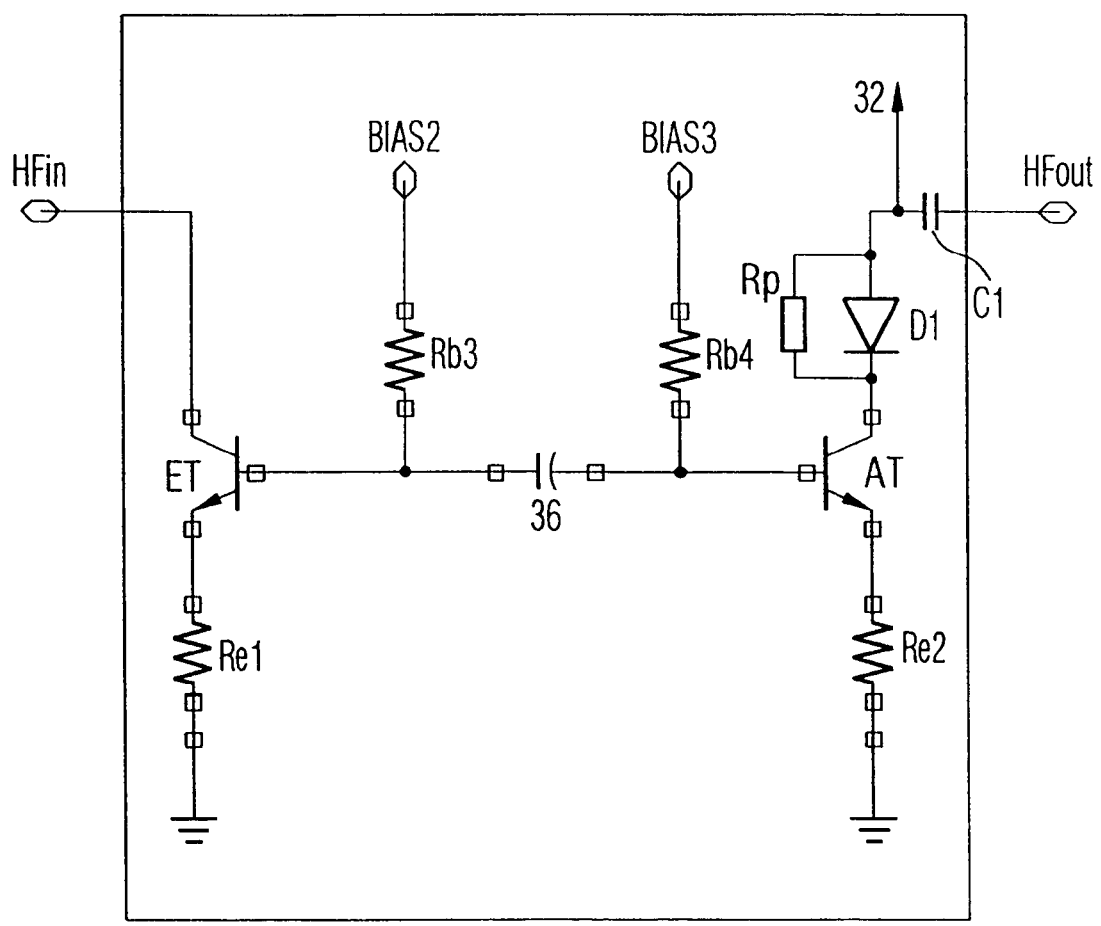
FIG. 5 is a further embodiment of a secondary stage amplifier for an inventive amplifier circuit.

An alternative design of an inventive secondary stage amplifier is shown in FIG. 5, wherein elements, which can correspond to those in FIG. 3, are designated with the same reference numbers.

According to FIG. 5, instead of a common bias means for the input bipolar transistor and the output bipolar transistor, a respective separate bias means is provided. Thereby, the base of the input bipolar transistor ET is connected to a first bias terminal Bias2 via a bias resistor Rb3, while the base terminal of the output bipolar transistor AT is connected to a second bias terminal Bias3 via a bias resistor Rb4. To obtain decoupling of the biases provided over the receptive bias terminals Bias2 and Bias3, respectively, the base terminals of the input bipolar transistor ET and the output bipolar transistor AT are DC separated and high frequency-coupled via a coupling capacitor 36. Thus, according to the embodiment shown in FIG. 5, it is possible to set the base potentials of the input bipolar transistor ET and the output bipolar transistor AT separately from on another.

The bias voltage at the bias terminals Bias1, Bias2 and Bias3 for switching-on and switching-off, respectively, of main and secondary stages is applied depending on the level of an input signal applied at the RF input. For controlling the application of the bias voltage, an external control signal is provided, which is generated depending on scanning a level of this input signal.

Although embodiments have been described above, where merely one secondary stage is connected in parallel to a main stage, an inventive controller circuit can have a plurality of secondary stages, which are connected in parallel to a main stage, wherein the respective secondary stages are decoupled from other stages in the inactive state by the described small capacities. The present invention enables thus the realization of amplifier circuits with three or more different gain stages with very high linearity. Above that, the inventive active secondary stages provide a high reverse attenuation, which is required in many applications of RF amplifiers, wherein such a reverse attenuation cannot be achieved by passive stages, where the forward attenuation and reverse attenuation are equal.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMBER LIST 10 main stage amplifier
VT1 main stage transistor
HFin RF input
HFout RF output
VC1 decoupling capacitor
VR1, VR2 resistors VL1 inductance
Vcc supply voltage potential
$L_{ext}$ external inductivity
$C_{ext}$ external capacity
20 gain step circuit
22 circuit node
T1 transistor
R1 resistor
24 capacity
VR1 bias resistor
26 bias terminal
30 secondary stage amplifier
ET input bipolar transistor
AT output bipolar transistor
Re1, Re2 emitter resistors
D1 diode
C1 decoupling capacitor
32 supply voltage terminal
Rb1, Rb2 bias resistors
Bias1 bias terminal
Bias2 bias terminal
Bias3 bias terminal
34 circuit node
Rb3, Rb4 bias resistors
36 coupling capacitor
Rp parallel resistor

What is claimed is:

1. An amplifier circuit, comprising:
 a main stage amplifier connected between an RF input (HFin) and an RF output; and
 at least one secondary stage amplifier, which is connected in parallel to the main stage amplifier between the RF input and the RF output, wherein the secondary stage amplifier comprises:
  an input bipolar transistor having at least one of a collector terminal and an emitter terminal high frequency-coupled to the RF input;
  an output bipolar transistor having a base terminal high frequency-coupled to the base terminal of the input bipolar transistor, the output bipolar transistor having at least one of a collector terminal and an emitter terminal high frequency coupled to the RF output, wherein the output bipolar transistor is further operably coupled to a supply voltage terminal.

2. The amplifier circuit according to claim 1, wherein a DC decoupling device is interposed between the supply voltage terminal and the RF output.

3. The amplifier circuit according to claim 1, wherein the secondary stage amplifier further has a bias input, the bias input operable to apply a bias voltage to the base terminal of the input bipolar transistor and apply a bias voltage to the base terminal of the output bipolar transistor, to thereby activate the secondary stage amplifier.

4. The amplifier circuit according to claim 3, wherein the collector of the input bipolar transistor is high frequency-coupled to the RF input, and wherein the collector of the output bipolar transistor is high frequency-coupled to the RF output, wherein application of the bias voltage operates to bias the collector base diode of the input bipolar transistor in flow direction, and to provide the base terminal of the output bipolar transistor with an operating point potential when the secondary stage amplifier is switched-on.

5. The amplifier circuit according to claim 4, wherein the bias input is operable to apply of the bias voltage such that the collector base diode of the input bipolar transistor and the collector base diode of the output bipolar transistor are reverse-polarized when the secondary stage amplifier is switched-off.

6. The amplifier circuit according to claim 3, wherein the bias input is operable to apply the bias voltage such that the bias voltage switches the secondary stage amplifier on and off, depending on a level of the RF input signal.

7. The amplifier circuit according to claim 1, wherein the main stage amplifier has an amplifier bipolar transistor, whose base terminal is connected to the RE input, wherein the input bipolar transistor of the secondary stage amplifier is connected to draw the base potential of the amplifier bipolar transistor on such a potential that the main stage amplifier is switched-off when the secondary stage amplifier is switched-on.

8. The amplifier circuit according to claim 3, wherein the bias input includes a bias terminal and a resistor connected between the bias terminal and the base terminals of the input bipolar transistor and the output bipolar transistor.

9. The amplifier circuit according to claim 8, wherein a further resistor is connected between the base terminal of the at least one of the input bipolar transistor and the output bipolar transistor and the resistor.

10. The amplifier circuit according to claim 3, wherein the bias input comprises a first bias terminal and a second bias terminal, a first resistor connected between the first bias voltage terminal and the base terminal of the input bipolar transistor, and a second resistor connected between the second bias terminal and the base terminal of the output bipolar transistor, and wherein the base terminals of the input bipolar transistor and the output bipolar transistor are coupled via a capacitor.

11. The amplifier circuit according to claim 1, wherein a diode is connected between the terminal of the output bipolar transistor that is high frequency-coupled to the RF output and the RF output, wherein the diode is operated in flow direction when the secondary stage amplifier is switched-on.

12. The amplifier circuit according to claim 11, wherein a high-impedance resistor is connected in parallel to the diode.

13. An amplifier circuit; comprising:
 a main stage amplifier connected between an RF input and an RF output, the main stage amplifier having an amplifier bipolar transistor, the amplifier bipolar transistor having a base terminal is connected to the RF input; and
 at least one secondary stage circuit, which is connected in parallel to the main stage amplifier between the RF input and the RF output, wherein the secondary stage circuit comprises:
  a first bipolar transistor having at least one of a collector terminal and an emitter terminal high frequency-coupled to the RF input;
  a second bipolar transistor having a base terminal high frequency-coupled to the base terminal of the first bipolar transistor, the second bipolar transistor having at least one of a collector terminal and an emitter terminal high frequency coupled to the RF output, wherein the second bipolar transistor is further operably coupled to a supply voltage terminal, the supply voltage terminal DC-decoupled from the RF output,
  wherein the first bipolar transistor of the secondary stage circuit is connected to draw the base potential of the amplifier bipolar transistor on such a potential that the main stage amplifier is switched-off when the secondary stage circuit is switched-on.

14. The amplifier circuit according to claim 13, further comprising at least one capacitor interposed between the supply voltage terminal and the RF output.

15. The amplifier circuit according to claim 13, wherein the secondary stage circuit further has a bias input, the bias input operable to apply a bias voltage to the base terminal of the first bipolar transistor and apply a bias voltage to the base terminal of the second bipolar transistor, to thereby activate the secondary stage circuit.

16. The amplifier circuit according to claim 15, wherein the collector of the first bipolar transistor is high frequency-coupled to the RF input, and wherein the collector of the second bipolar transistor is high frequency-coupled to the RF output, wherein application of the bias voltage operates to bias the collector base diode of the first bipolar transistor in flow direction, and to provide the base terminal of the second bipolar transistor with an operating point potential when the secondary stage circuit is switched-on.

17. The amplifier circuit according to claim 15, wherein the bias input is operable to apply of the bias voltage such that the collector base diode of the first bipolar transistor and the collector base diode of the second bipolar transistor are reverse-polarized when the secondary stage circuit is switched-off.

18. The amplifier circuit according to claim 15, wherein the bias input includes a bias terminal and a resistor connected between the bias terminal and the base terminals of the first bipolar transistor and the second bipolar transistor.

19. The amplifier circuit according to claim 15, wherein the bias input comprises a first bias terminal and a second bias terminal, a first resistor connected between the first bias voltage terminal and the base terminal of the first bipolar transistor, and a second resistor connected between the second bias terminal and the base terminal of the second bipolar transistor, and wherein the base terminals of the first bipolar transistor and the second bipolar transistor are DC-decoupled.

20. The amplifier circuit according to claim 13, wherein a diode is connected between the terminal of the second bipolar transistor that is high frequency-coupled to the RF output and the RF output, wherein the diode is operated in flow direction when the secondary stage circuit is switched-on.

* * * * *